(12) United States Patent
Zucker et al.

(10) Patent No.: US 11,340,315 B2
(45) Date of Patent: May 24, 2022

(54) EARBUD CASE WITH HALL EFFECT SENSOR AND RELATED HOLDER

(71) Applicant: Bose Corporation, Framingham, MA (US)

(72) Inventors: Natalie Zucker, Allston, MA (US); Zachary Mark Temple, Boston, MA (US); Steven Torku, Uxbridge, MA (US); Daniel Francis Tonderys, Raynham, MA (US); Nathaniel Fernandes, Boston, MA (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 16/987,657

(22) Filed: Aug. 7, 2020

(65) Prior Publication Data

US 2022/0043078 A1    Feb. 10, 2022

(51) Int. Cl.
*H04R 1/10* (2006.01)
*G01R 33/07* (2006.01)
*H02J 7/00* (2006.01)

(52) U.S. Cl.
CPC ......... *G01R 33/072* (2013.01); *H04R 1/1025* (2013.01); *H02J 7/0044* (2013.01); *H04R 1/1016* (2013.01)

(58) Field of Classification Search
CPC .... H04R 1/1025; H04R 1/1016; G01R 33/07; G01R 33/072; H02J 7/0044
See application file for complete search history.

(56) References Cited

U.S. PATENT DOCUMENTS

| | | | |
|---|---|---|---|
| 11,044,543 B2* | 6/2021 | Cohen | H04R 1/1016 |
| 2010/0225208 A1* | 9/2010 | Green | H02K 29/08 310/68 B |
| 2020/0107110 A1* | 4/2020 | Ji | H04R 1/023 |
| 2020/0233046 A1* | 7/2020 | Ding | H02J 7/025 |
| 2021/0112672 A1* | 4/2021 | Cazalet | A45C 13/005 |

* cited by examiner

*Primary Examiner* — Jason R Kurr
(74) *Attorney, Agent, or Firm* — Hoffman Warnick LLC

(57) ABSTRACT

Various implementations include earbud cases with a Hall effect sensor configured to aid in detecting whether the case is open or closed. Certain additional implementations include a holder for a Hall effect sensor in an earbud case. In some particular aspects, a case for a set of earbuds includes: a top section including a set of magnets; and a base section movably coupled with the top section, the base section having: an upper compartment including a set of slots for holding the earbuds; and a lower compartment, having: a printed circuit board (PCB); a holder coupled with the PCB; and a Hall effect sensor coupled with holder, wherein the holder separates the Hall effect sensor from the PCB.

9 Claims, 4 Drawing Sheets

EARBUD CASE WITH HALL EFFECT SENSOR AND RELATED HOLDER

TECHNICAL FIELD

This disclosure generally relates to in-ear audio devices, sometimes referred to as earbuds. More particularly, the disclosure relates to earbud cases and holders for sensors in earbud cases.

BACKGROUND

Detecting opening and closure of audio device casings can be beneficial, e.g., for controlling device functions and limiting battery usage.

SUMMARY

All examples and features mentioned below can be combined in any technically possible way.

Various implementations include earbud cases with a Hall effect sensor configured to aid in detecting whether the case is open or closed. Certain additional implementations include a holder for a Hall effect sensor in an earbud case.

In some particular aspects, a case for a set of earbuds includes: a top section including a set of magnets; and a base section movably coupled with the top section, the base section having: an upper compartment including a set of slots for holding the earbuds; and a lower compartment, having: a printed circuit board (PCB); a holder coupled with the PCB; and a Hall effect sensor coupled with holder, wherein the holder separates the Hall effect sensor from the PCB.

In other particular aspects, a holder for a Hall effect sensor includes: a base for coupling to a printed circuit board (PCB); and at least one protrusion extending from the base away from the PCB, where the at least one protrusion defines a slot that is shaped to accommodate the Hall effect sensor.

Implementations may include one of the following features, or any combination thereof.

In some cases, the Hall effect sensor is configured to detect proximity to at least one of the set of magnets.

In certain aspects, the lower compartment further includes a controller coupled with the Hall effect sensor.

In particular implementations, the controller is configured to take a prescribed action in response to the Hall effect sensor indicating proximity to a plurality of the set of magnets.

In some cases, the top section is configured to slide relative to the base section to open and close the case.

In certain aspects, the holder is directly coupled to the PCB, and the Hall effect sensor is directly coupled to the holder.

In some implementations, the holder has a slot that is shaped to accommodate the Hall effect sensor in only one orientation.

In some aspects, the orientation is a vertical orientation.

In certain cases, the holder includes: a base coupled to the PCB; and at least one protrusion extending from the base away from the PCB, the at least one protrusion defines the slot that is shaped to accommodate the Hall effect sensor.

In particular implementations, the holder maintains a distance between the Hall effect sensor and the top section such that the Hall effect sensor is sensitive to a magnetic flux from each of the set of magnets for detecting a change between an open position and a closed position of the top section relative to the base section.

In some cases, when coupled to the PCB, the holder separates the Hall effect sensor from the PCB.

In certain implementations, in an earbud case with a set of magnets, the holder positions the Hall effect sensor to detect proximity to at least one of a set of magnets.

In particular aspects, when coupled to the PCB in the earbud case, the holder maintains a distance between the Hall effect sensor and the set of magnets such that the Hall effect sensor is sensitive to a magnetic flux from each of the set of magnets for detecting a change between an open position and a closed position of the earbud case.

In certain cases, the base is sized to directly couple to the PCB, and the at least one protrusion is sized to directly couple with the Hall effect sensor.

In some implementations, the slot complements the Hall effect sensor and is shaped to accommodate the Hall effect sensor in only one orientation.

In particular cases, the at least one protrusion includes two distinct protrusions.

In certain aspects, the slot is asymmetrically shaped to complement an asymmetrical shaping of the Hall effect sensor.

Two or more features described in this disclosure, including those described in this summary section, may be combined to form implementations not specifically described herein.

The details of one or more implementations are set forth in the accompanying drawings and the description below. Other features, objects and advantages will be apparent from the description and drawings, and from the claims.

Figure 1:
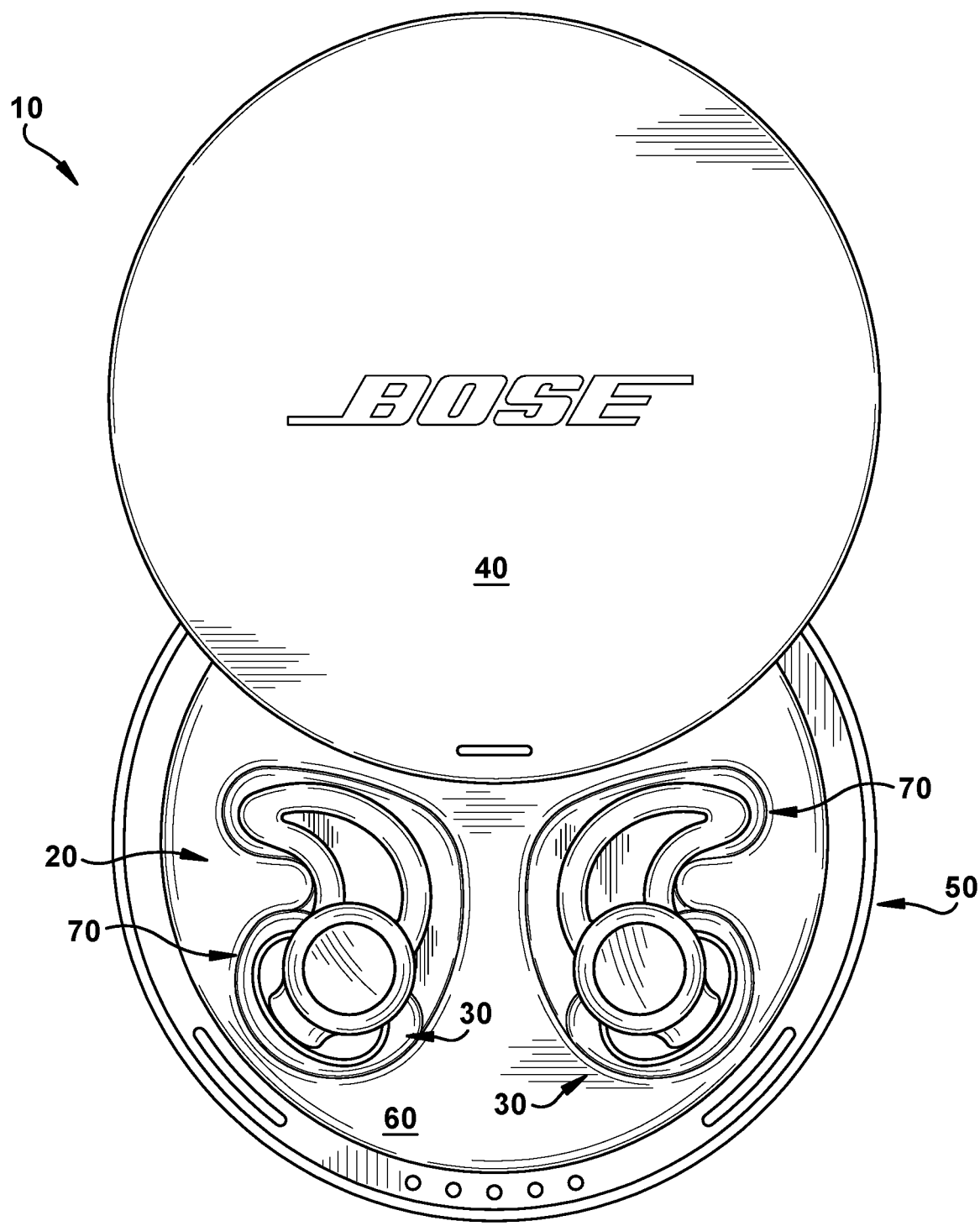
FIG. 1 is a schematic depiction of a case for an in-ear audio device according to various implementations.

It is noted that the drawings of the various implementations are not necessarily to scale. The drawings are intended to depict only typical aspects of the disclosure, and therefore should not be considered as limiting the scope of the implementations. In the drawings, like numbering represents like elements between the drawings.

DETAILED DESCRIPTION

This disclosure is based, at least in part, on the realization that a Hall effect sensor can be used in an earbud case to aid in detecting an open and/or closed state of the case. In certain implementations, a Hall effect sensor is coupled to a holder that is in turn coupled with a printed circuit board (PCB) in the base of the case. The Hall effect sensor is configured to detect proximity to a set of magnets in the top section of the case, indicating whether the case is open or closed. In certain cases, the holder for the Hall effect sensor orients that Hall effect sensor to effectively detect proximity to the magnets.

Commonly labeled components in the FIGURES are considered to be substantially equivalent components for the purposes of illustration, and redundant discussion of those components is omitted for clarity. Numerical ranges and values described according to various implementations are merely examples of such ranges and values, and are not intended to be limiting of those implementations. In some cases, the term "approximately" is used to modify values, and in these cases, can refer to that value+/−a margin of error, such as a measurement error, which may range from up to 1-5 percent.

Aspects and implementations disclosed herein may be applicable to a wide variety of wearable audio devices in various form factors, such as head-worn devices (e.g., headsets, headphones, earphones, eyeglasses, helmets, hats, visors), neck-worn speakers, shoulder-worn speakers, body-worn speakers (e.g., watches), etc. Some particular aspects disclosed may be applicable to personal (wearable) audio devices such as in-ear audio devices, or earbuds. It should be noted that although specific implementations of audio devices primarily serving the purpose of acoustically outputting audio are presented with some degree of detail, such presentations of specific implementations are intended to facilitate understanding through provision of examples and should not be taken as limiting either the scope of disclosure or the scope of claim coverage.

The wearable audio devices disclosed herein can include additional features and capabilities not explicitly described. These wearable audio devices can include additional hardware components, such as one or more cameras, location tracking devices, microphones, etc., and may be capable of voice recognition, visual recognition, and other smart device functions. The description of wearable audio devices included herein is not intended to exclude these additional capabilities in such a device.

Figure 2:
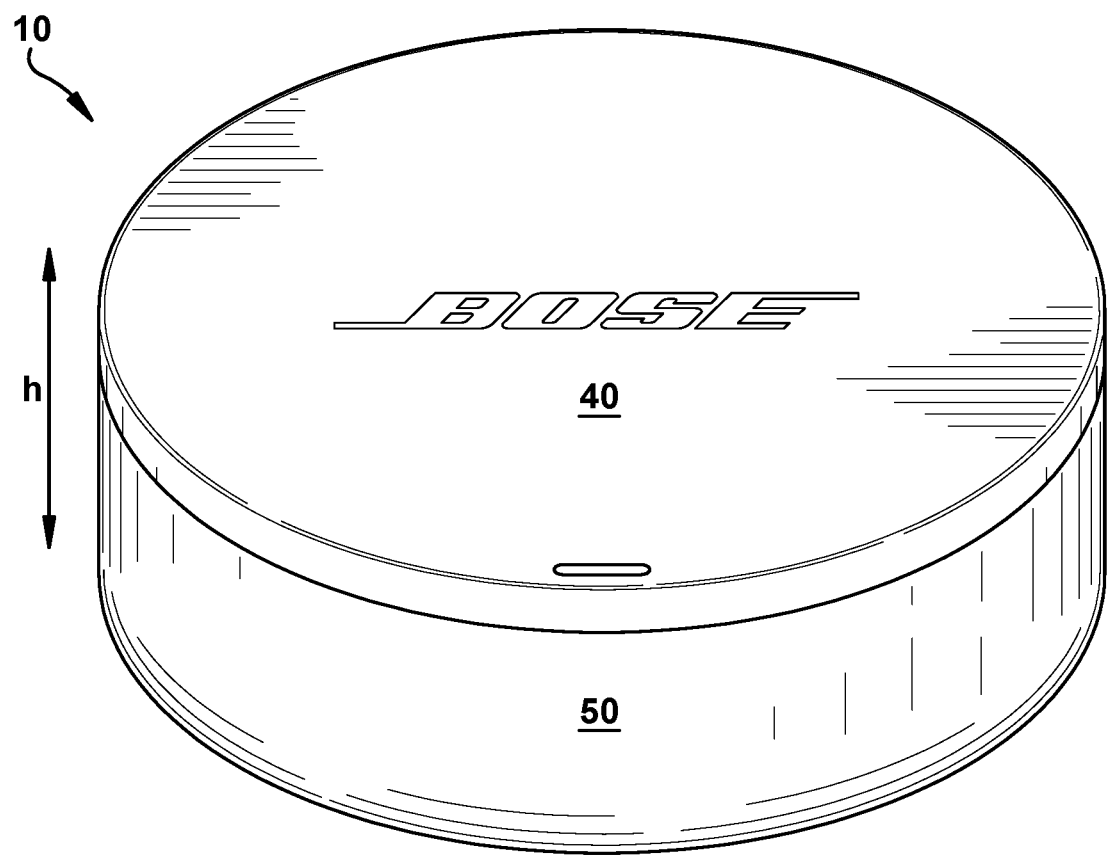
FIG. 2 is a depiction of the case in FIG. 1, in a closed position.

FIG. 1 is a schematic depiction of a case 10 for an audio device 20, in an open position. FIG. 2 is a schematic depiction of the case 10 in a closed position (e.g., a fully closed position). FIGS. 1 and 2 are referred to simultaneously. In this example, the audio device 20 includes a set of in-ear audio devices, or earbuds 30. However, additional implementations include cases for distinct audio devices, e.g., audio headsets in different form factors, audio eyeglasses, audio jewelry, etc. In certain implementations, the case 10 is a relatively low-profile case, e.g., having a total height (h) of less than several inches (or, approximately 5-10 centimeters). The case 10 is sized to accommodate the audio device 20, such that a top section 40 moves relative to a base section 50 to open and close the case 10. In this implementation, the top section 40 is configured to slide relative to the base section 50 to open and close the case 10, e.g., such that the top section 40 moves tangentially relative to the base section 50 to reveal an upper compartment 60 in the base section 50. In these cases, the top section 40 remains on substantially the same plane as it moves relative to the base section 50. The upper compartment 60 has a set of slots 70 (e.g., one or more slots) for holding the earbuds 30. Under the upper compartment 60, is a lower compartment 80, illustrated in detail in the separated perspective view in FIG. 3. The lower compartment 80 is shown including a printed circuit board (PCB) 90, a holder 100 coupled with the PCB 90, and a Hall effect sensor 110 coupled with the holder 100. In various implementations, the holder 100 separates the Hall effect sensor 110 from the PCB 90.

Figure 3:
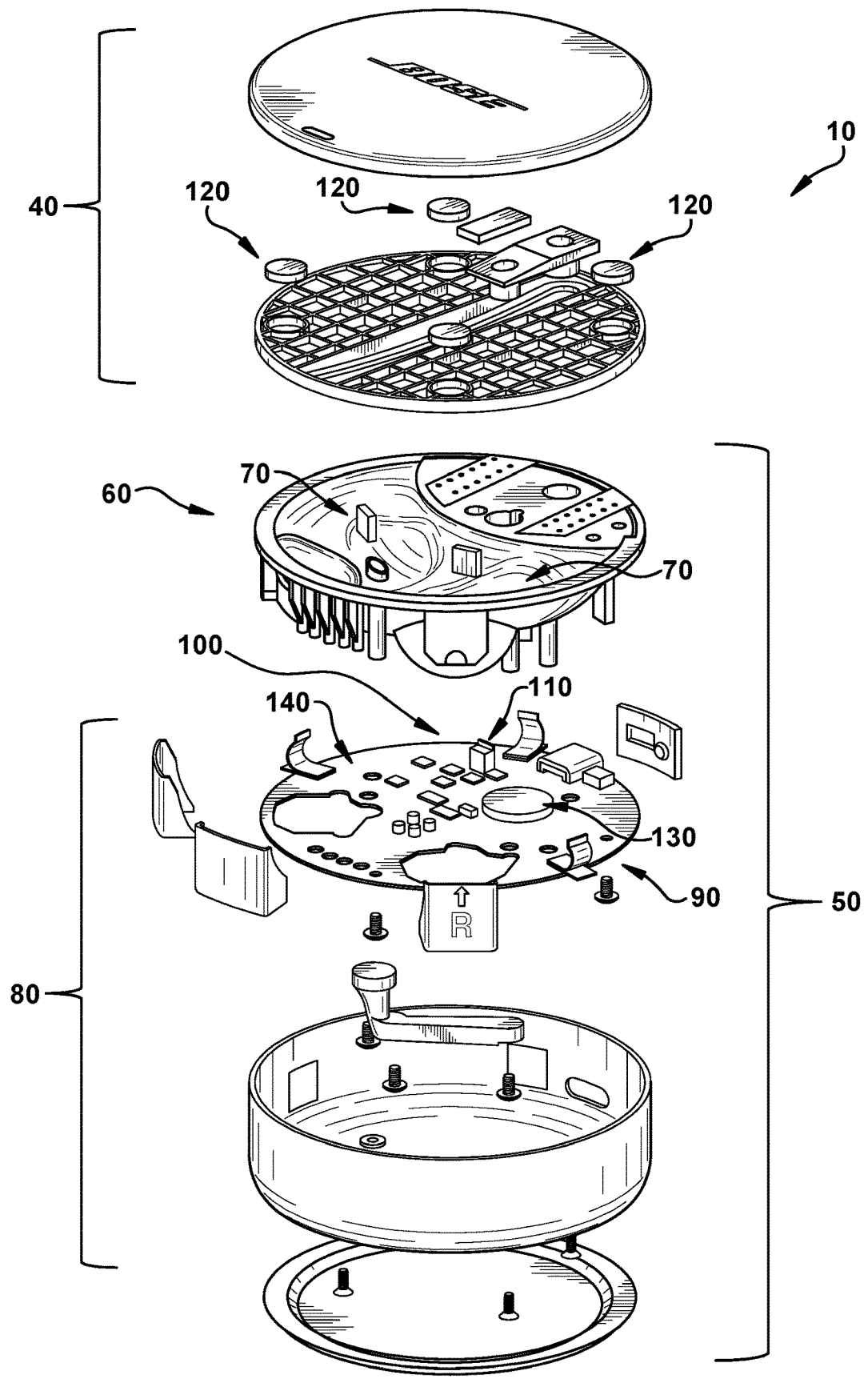
FIG. 3 is a separated perspective view of an in-ear audio device case according to various implementations.

With continuing reference to FIG. 3, in various implementations, the Hall effect sensor 110 is configured to detect proximity to at least one of a set of magnets 120 in the top section 40 of the case 10 (e.g., between a top cap and an intermediate layer). That is, the Hall effect sensor 110 is configured to sense proximity to one or more magnets 120 in the top section 40 of the case 10 based on the position of the top section 40 relative to the bottom section 50. In particular, the Hall effect sensor 110 is configured to sense magnetic flux from nearby magnets such as the magnets 120 in the top section 40 of the case 10. In particular cases, the holder 100 maintains a distance between the Hall effect sensor 110 and the top section 40 such that the Hall effect sensor 110 is sensitive to a magnetic flux from each of the set of magnets 120 (e.g., two or more magnets) in order to detect a change between an open position (e.g., FIG. 1) and a closed position (FIG. 2) of the top section 40 relative to the bottom section 50.

In certain implementations, the case 10 further includes a controller 130 (e.g., a control circuit, control chip and/or control chipset) coupled with the Hall effect sensor 110 (e.g., directly or via PCB wiring). According to some implementations, the controller 130 is configured to take a prescribed action in response to the Hall effect sensor 110 indicating proximity to a plurality of the magnets 120, e.g., proximity to two, three, or more magnets 120 in the top section 40. In some cases, proximity to a threshold number of magnets 120 in the top section 40 is required for the controller 130 to take one or more prescribed actions. In particular examples, proximity between the Hall effect sensor 110 and all magnets 120 in the top section is required for the controller 130 to take one or more prescribed actions. In some examples, when the controller 130 receives a signal from the Hall effect sensor 110 that indicates proximity to a plurality of magnets 120, the logic in the controller 130 infers that the case is closed or is in the process of closing, and initiates a prescribed action. In certain cases, the prescribed action can include initiating a charging process for the earbuds 30, terminating a charging process for the earbuds 30, powering down the earbuds 30, turning on a light or other indicator on the case 10 to indicate closure or charging status, etc. In particular cases, the controller 130 is configured to initiate one or more prescribed actions in response to the Hall effect sensor 110 indicating that proximity is no longer detected between a threshold number of magnets 120. Example actions can include terminating a charging process for the earbuds 30, turning off a light indicator on the case 10, switching the earbuds 30 to a power conservation mode, turning on microphone functionality on the earbuds 30, etc.

Figure 4:
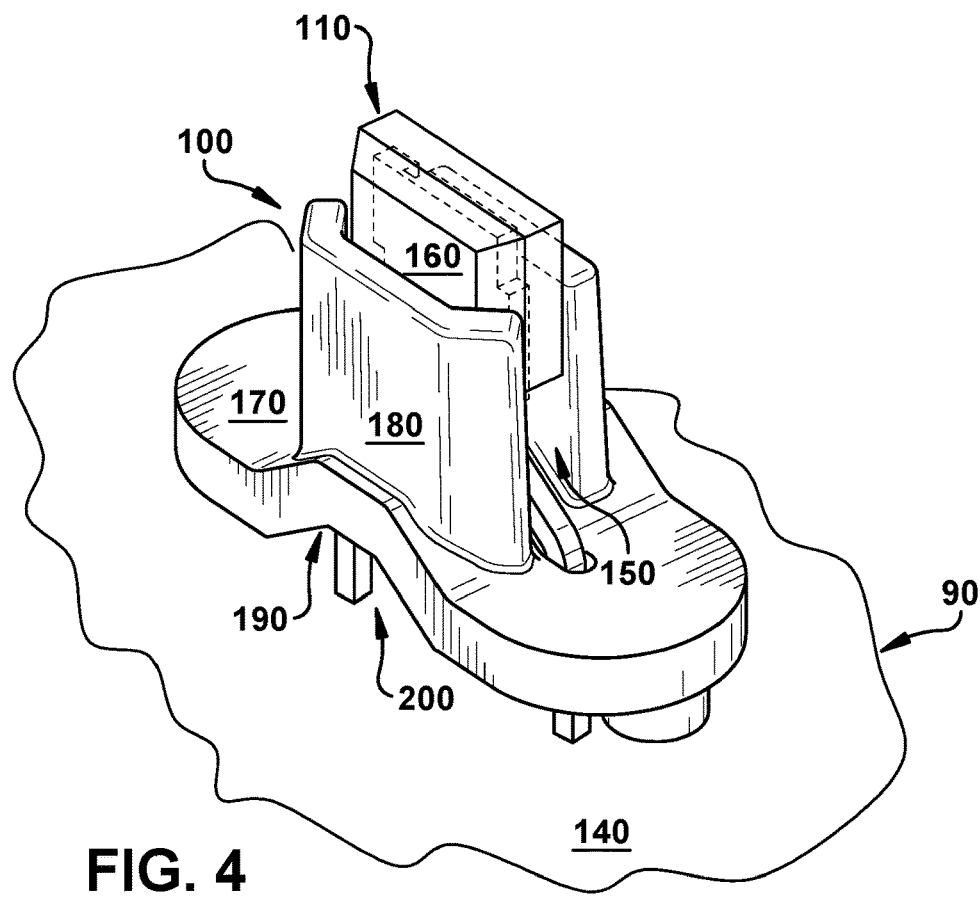
FIG. 4 is a first perspective view of a holder for a Hall effect sensor according to various implementations.
Figure 5:
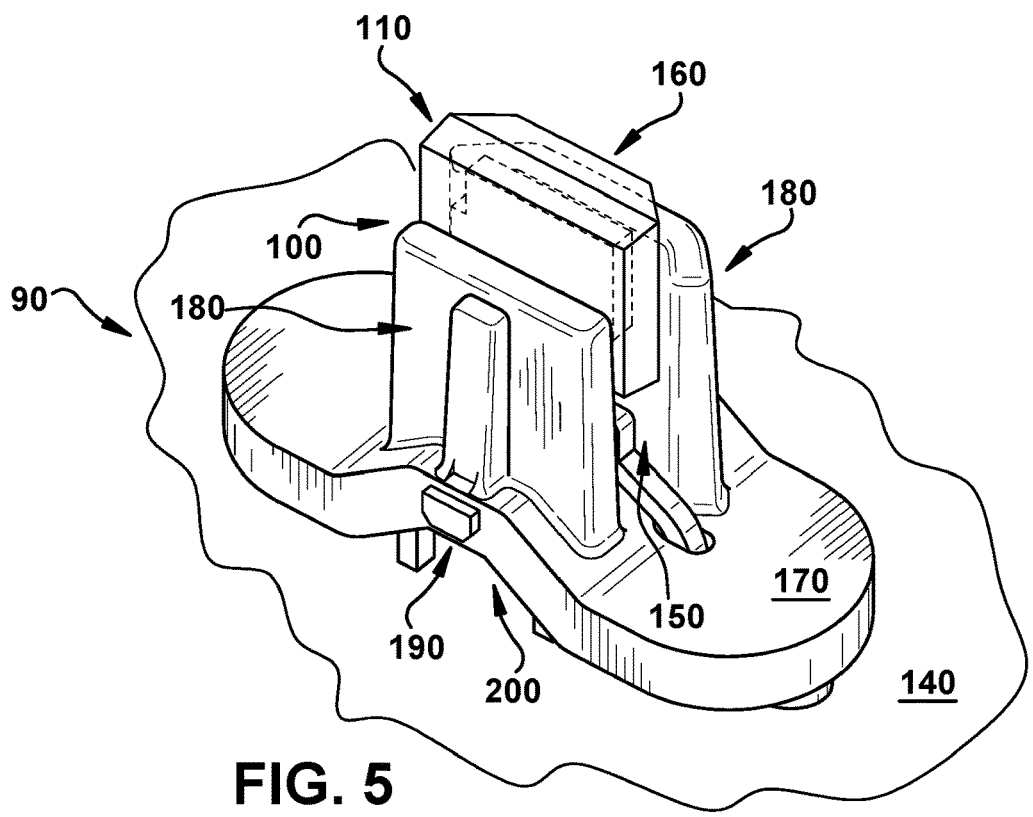
FIG. 5 is a second perspective view of the holder for a Hall effect sensor of FIG. 5.

As described according to various implementations, and also shown in the separated perspective in FIG. 3, the holder 100 is directly coupled to the PCB 90, such that an intervening coupler, separator, shim, etc. is not required to connect the holder 100 and the PCB 90. In these cases, the holder can be directly coupled (e.g. fastened or affixed) to the top-facing surface 140 (e.g., when case 10 is upright) of the PCB 90. In particular cases, as illustrated in distinct perspective views of the holder 100 in FIGS. 4 and 5, the Hall effect sensor 110 is directly coupled to the holder 100. According to some implementations, the holder 100 has a slot 150 that is shaped to accommodate the Hall effect sensor 110 in only one orientation. That is, the slot 150 is shaped to complement the Hall effect sensor 110 such that the Hall effect sensor 110 can only be secured in the slot 150 in one orientation, e.g., the vertical orientation (such that the sensor 110 is on its side). In certain cases, the slot 150 is oriented such that a top surface 160 of the Hall effect sensor 110 can only be aligned in one direction. In other terms, the slot 150 has a "poka-yoke" configuration that prevents inserting the Hall effect sensor 110 in an undesired orientation. In other terms, the slot 150 is asymmetrically shaped to complement an asymmetrical shaping of the Hall effect sensor 110.

In particular cases, the holder 100 includes a base 170 that is coupled to the PCB 90, and at least one protrusion 180 extending from the base 170 away from the PCB 90. In various implementations, the protrusion 180 defines the slot 150 that is shaped to accommodate the Hall effect sensor 110. In certain cases, two or more distinct protrusions 180 define the slot 150. When assembled (i.e., coupled to the PCB 90), the holder 100 separates the Hall effect sensor 110 from the PCB 90. In some cases, the base 170 can include a ridge (or mound, or spike, etc.) 190 that is spaced from the PCB 90 (e.g., space 200 shown between lower surface of the holder 100 and the PCB 90). As described herein, the holder 100, including the base 170 and protrusion(s) 180 is configured to hold the Hall effect sensor 110 in a position and orientation to detect proximity to one or more of the magnets 120 in the top section 40 of the case 10 (FIG. 3). That is, when coupled with the PCB 90, the holder 100 maintains a distance between the Hall effect sensor 110 and the magnet(s) 120 such that the Hall effect sensor 110 is sensitive to a magnetic flux from each of those magnets 120 in order to detect a change between the open (FIG. 1) and closed (FIG. 2) positions.

In any case, the earbud cases and sensor holders shown and described according to various implementations can enable effective detection of opening and closure of the case, with a reliable sensor mechanism (e.g., a Hall effect sensor). Additionally, the sensor holder mitigates variation and/or error in installation of the sensor(s).

In various implementations, components described as being "coupled" to one another can be joined along one or more interfaces. In some implementations, these interfaces can include junctions between distinct components, and in other cases, these interfaces can include a solidly and/or integrally formed interconnection. That is, in some cases, components that are "coupled" to one another can be simultaneously formed to define a single continuous member. However, in other implementations, these coupled components can be formed as separate members and be subsequently joined through known processes (e.g., soldering, fastening, ultrasonic welding, bonding). In various implementations, electronic components described as being "coupled" can be linked via conventional hard-wired and/or wireless means such that these electronic components can communicate data with one another. Additionally, sub-components within a given component can be considered to be linked via conventional pathways, which may not necessarily be illustrated.

Other embodiments not specifically described herein are also within the scope of the following claims. Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

We claim:

1. A case for a set of earbuds, the case comprising:
a top section comprising a set of magnets; and
a base section movably coupled with the top section,
wherein the top section is configured to slide tangentially relative to the base section to open and close the case, such that the top section remains on substantially a same plane as it moves relative to the base section,
wherein the base section comprises:
an upper compartment comprising a set of slots for holding the earbuds; and
a lower compartment, comprising:
a printed circuit board (PCB);
a holder coupled with the PCB;
a Hall effect sensor coupled with holder, wherein the holder separates the Hall effect sensor from the PCB; and
a controller coupled with the Hall effect sensor, wherein the controller is configured to take a prescribed action in response to the Hall effect sensor indicating proximity to a plurality of the set of magnets,
wherein the controller is configured to take the prescribed action in response to the Hall effect sensor indicating proximity to a threshold number of the plurality of the set of magnets.

2. The case of claim 1, wherein the Hall effect sensor is configured to detect proximity to at least one of the set of magnets.

3. The case of claim 1, wherein the holder is directly coupled to the PCB, and wherein the Hall effect sensor is directly coupled to the holder.

4. The case of claim 1, wherein the holder has a slot that is shaped to accommodate the Hall effect sensor in only one orientation.

5. The case of claim 4, wherein the orientation comprises a vertical orientation.

6. The case of claim 4, wherein the holder comprises:
a base coupled to the PCB; and
at least one protrusion extending from the base away from the PCB, wherein the at least one protrusion defines the slot that is shaped to accommodate the Hall effect sensor.

7. The case of claim 1, wherein the holder maintains a distance between the Hall effect sensor and the top section such that the Hall effect sensor is sensitive to a magnetic flux from each of the set of magnets for detecting a change between an open position and a closed position of the top section relative to the base section.

8. The case of claim 1, wherein the holder maintains a distance between the Hall effect sensor and the top section such that the Hall effect sensor is sensitive to a magnetic flux from each of the set of magnets for detecting a change between an open position and a closed position of the top section relative to the base section as the top section slides tangentially relative to the base section.

9. The case of claim 1, wherein the threshold number is equal to at least two.

* * * * *